US007333313B2

(12) United States Patent
Bouchard et al.

(10) Patent No.: US 7,333,313 B2
(45) Date of Patent: Feb. 19, 2008

(54) MULTIPLEXED TEMPERATURE SENSING CIRCUIT FOR HID LAMP BALLAST

(75) Inventors: Guy P. Bouchard, Beverly, MA (US); John E. Cross, Needham, MA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 11/448,667

(22) Filed: Jun. 8, 2006

(65) Prior Publication Data

US 2006/0290209 A1 Dec. 28, 2006

Related U.S. Application Data

(60) Provisional application No. 60/690,784, filed on Jun. 15, 2005.

(51) Int. Cl.
*H02H 5/05* (2006.01)
*G01R 31/02* (2006.01)

(52) U.S. Cl. .................. 361/93.8; 361/93.1; 361/93.7; 324/417; 324/431; 315/309; 315/307

(58) Field of Classification Search .................... None
See application file for complete search history.

(56) References Cited

U.S. PATENT DOCUMENTS 5,612,623 A * 3/1997 Watanabe et al. ........... 324/549
6,320,450 B1 * 11/2001 Lee et al. .................. 327/513

* cited by examiner

*Primary Examiner*—Tuyet Vo
(74) *Attorney, Agent, or Firm*—Young & Thompson

(57) ABSTRACT

A temperature sensing circuit for a ballast for a HID lamp multiplexes the temperature measurement function with another function to reduce the number of pins required for the temperature measurement function performed by the microcontroller of the ballast. The circuit includes a microcontroller having a first A/D input/output pin, a second A/D input/output pin and a multifunction pin, a temperature measurement circuit connected to the second A/D pin, a timing circuit connected to the first A/D pin, and a switch connected to the multifunction pin, temperature measurement circuit and timing circuit. The switch activates the temperature measurement function by connecting the temperature measurement circuit to the multifunction pin in a first position and deactivates the function by disconnecting the temperature measurement circuit from the multifunction pin in a second position.

11 Claims, 1 Drawing Sheet

MULTIPLEXED TEMPERATURE SENSING CIRCUIT FOR HID LAMP BALLAST

BACKGROUND OF THE INVENTION

The present invention is directed to a circuit that senses a temperature of a circuit board in a ballast of a high-intensity discharge (HID) lamp.

A HID lamp has an arc discharge contained within an arc tube and may be, for example, a mercury vapor, metal halide, low and high-pressure sodium, or xenon arc lamp. A HID lamp requires a ballast to start and maintain operation. A ballast is a device that provides the proper starting and operating electrical conditions. An electronic ballast uses solid state electronic circuitry to provide these conditions. Such solid state circuitry is well known and is not the subject of the present invention. However, one part of this circuitry is relevant to the present invention; in particular, the microcontroller.

A microcontroller is a computer-on-a-chip that is used to control an electronic device, such as the ballast of a HID lamp. The microcontroller is a single integrated circuit with a central processing unit, storage, peripherals as appropriate for the particular application, and connection pins for communicating signals and/or data. The circuitry for the ballast, including the microcontroller, is typically mounted on a printed circuit board (PCB).

During operation of a HID lamp, the PCB of the ballast may reach a temperature that can be harmful to the ballast or degrade ballast performance. The temperature of the PCB is monitored so that responsive steps can be taken as needed. The ballast microcontroller can be used to monitor the PCB temperature, provided the microcontroller has enough analog to digital (A/D) input pins available to be dedicated to temperature measurement functions.

If there are not enough microcontroller pins for the dedicated temperature measurement function, a strictly analog temperature compensation circuit can provide this function without involving the microcontroller. However, the degree of control is limited to one mode of operation and the analog compensation circuit is usually more sensitive to unit-to-unit variability than a microcontroller-based technique. Alternatively, a microcontroller with more pins can be provided, but the cost for this additional capability is higher and the additional pins increase the size of the microcontroller so as to require more real estate on the PCB.

SUMMARY OF THE INVENTION

An object of the present invention is to provide a novel temperature sensing circuit for a ballast for a HID lamp that avoids the problems of the prior art.

A further object of the present invention is to provide a novel temperature sensing circuit for a ballast for a HID lamp that multiplexes the temperature measurement function with another function to reduce the number of microcontroller pins required for the temperature measurement function of the microcontroller.

A yet further object of the present invention is to provide a ballast that includes a circuit board with HID lamp ballast circuitry that includes a microcontroller having a first A/D input/output pin, a second A/D input/output pin and a multifunction pin, a temperature measurement circuit that includes a thermistor for sensing a temperature of the circuit board and that is connected to the second A/D pin, a timing circuit connected to the first A/D pin, and a switch connected to the multifunction pin, the temperature measurement circuit and the timing circuit, where the switch connects the temperature measurement circuit to the multifunction pin in a first position and disconnects the temperature measurement circuit from the multifunction pin in a second position, and where the temperature measurement circuit is activated when the switch is in the first position and the timing circuit is operated and the temperature measurement circuit is deactivated when the switch is in the second position.

These and other objects and advantages of the invention will be apparent to those of skill in the art of the present invention after consideration of the following drawings and description of preferred embodiments.

DESCRIPTION OF PREFERRED EMBODIMENTS

A HID lamp ballast of the present invention multiplexes the temperature measurement function with another function to reduce the number of microcontroller pins required for the temperature measurement function of the microcontroller. In a preferred embodiment and with reference to FIG. 3, the ballast includes a circuit board (not shown) with HID lamp ballast circuitry that includes a microcontroller U1 having a first A/D input/output pin DIO1, a second A/D input/output pin DIO2, and a multifunction pin MF1. The ballast further include a temperature measurement circuit (shown separately in FIG. 1), a further circuit (such as the timing circuit shown separately in FIG. 2), and a switch Q1 connected to multifunction pin MF1, the temperature measurement circuit and the further circuit. As will be explained below, switch Q1 connects the temperature measurement circuit to multifunction pin MF1 in a first switch position and disconnects the temperature measurement circuit from multifunction pin MF1 in a second switch position. The temperature measurement circuit is activated when switch Q1 is in the first position, and the further (e.g., timing) circuit is operated and the temperature measurement circuit is deactivated when switch Q1 is in the second position.

Microcontroller U1 maybe any suitable microcontroller having at least one analog input and two digital outputs, such as a Microchip 16C716-E/SS 8-bit CMOS microcontroller.

Figure 1:
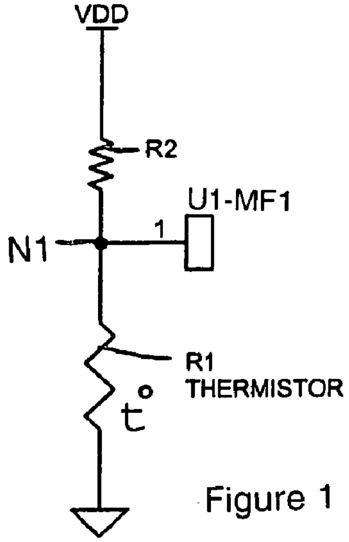
FIG. 1 is a circuit diagram of an embodiment of the temperature measurement circuit of the present invention.

With further reference now to FIG. 1, an embodiment of the temperature measurement circuit of the present invention includes a thermistor R1 mounted on the circuit board of the ballast to sense a temperature of the circuit board and a pull-up resistor R2, with the thermistor R1 and pull-up resistor R2 being connected in series between a power supply VDD and a ground. As is known, a thermistor is a type of resistor that senses a temperature change by sensing a change of resistance in the thermistor due to the temperature change. Multifunction pin MF1 of microcontroller U1 is connected to a first node N1 between thermistor R1 and pull-up resistor R2. The resistance of thermistor R1 changes with the temperature of the circuit board on which the thermistor is mounted. The change of resistance of thermistor R1 causes a corresponding change in voltage at multifunction pin MF1. By measuring the voltage at multifunction pin MF1, the microcontroller can determine the temperature of the circuit board using circuitry provided for that purpose.

Figure 2:
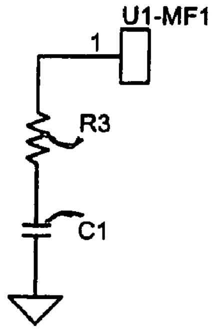
FIG. 2 is a circuit diagram of an embodiment of the timing circuit of the present invention.

The temperature measurement function of the temperature measurement circuit is multiplexed with the functions of a further circuit, such as the timing circuit shown in FIG. 2. The further circuit also may be a voltage divider circuit or some other relatively high impedance measurement circuit. The following describes the timing circuit embodiment, and one of skill in the art will appreciate how to apply this arrangement to the further circuit in the alternative embodiments. In the timing circuit, resistor R3 and capacitor C1 are connected in series between the multifunction pin MF1 and ground. Multifunction pin MF1 can act as a digital input/output to charge capacitor C1 (multifunction pin MF1 voltage high) or to discharge capacitor C1 (multifunction pin MF1 voltage low). Multifunction pin MF1 can also act as a high impedance A/D input to measure capacitor C1 voltage. Since the rate at which capacitor C1 voltage changes is a function of the voltage applied, the time since a prior measurement was taken can be determined by the voltage of the capacitor C1.

With reference again to FIG. 3, the temperature measurement circuit and timing circuit are combined with switch Q1 that multiplexes their functions. Switch Q1 may be a transistor of appropriate type and in one embodiment is a MOSFET. Switch Q1 may have its gate connected to the first node N1 between thermistor R1 and pull-up resistor R2. The second A/D input/output pin DIO2 is also connected to first node N1. A first terminal of switch Q1 is connected to power supply VDD and a second terminal is connected to a second node N2, with multifunction pin MF1 also being connected to second node N2. Resistor R3 and capacitor C1 of the timing circuit are connected to second node N2 through a further resistor R3', with capacitor C1 being connected to ground. First A/D input pin DIO1 is connected to a third node N3 between resistor R3 and further resistor R3'.

Figure 3:
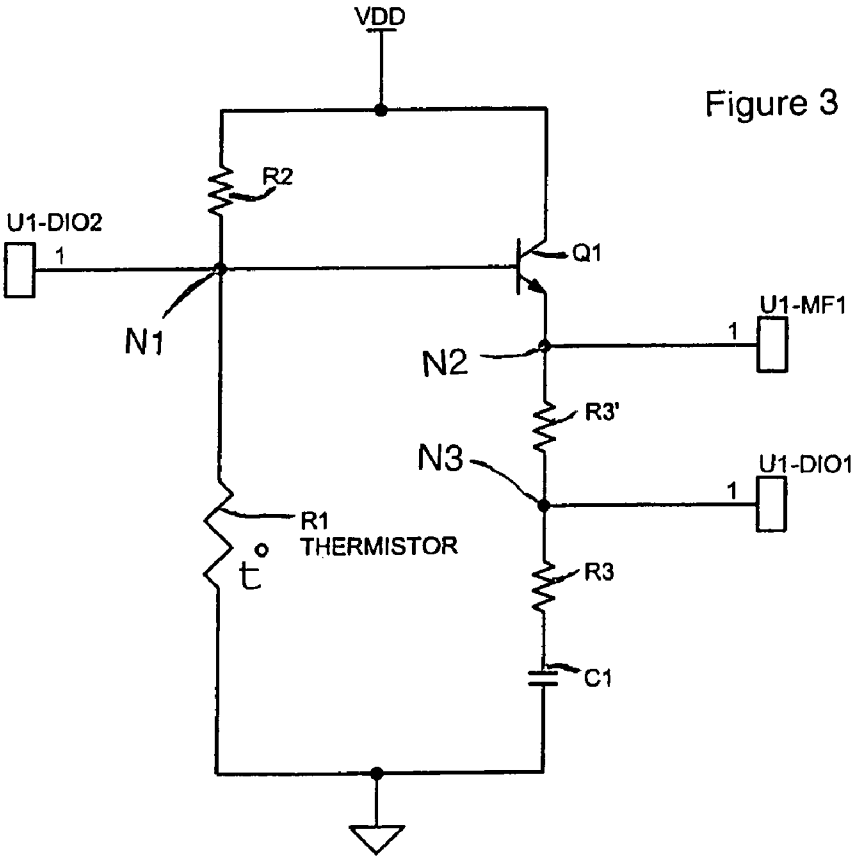
FIG. 3 is a circuit diagram of an embodiment of the temperature sensing circuit of the present invention for a ballast of a HID lamp.

In operation, the circuit of FIG. 3 is placed in a timing mode by allowing first A/D input/output pin DIO1 to float (setting high impedance) and setting second A/D input/output pin DIO2 to a low voltage. This effectively disconnects the temperature measurement circuit from the multifunction pin MF1 and allows measurement and control of the timing circuit by multifunction pin MF1 as described above in the discussion of FIG. 2. The temperature measurement circuit is activated by allowing second A/D input/output pin DIO2 to float and setting first A/D input/output pin DIO1 to a low voltage. When the temperature measurement circuit is activated, microcontroller U1 can measure the voltage at first node N1 between thermistor R1 and pull-up resistor R2 using multifunction pin MF1 and determine the temperature of the circuit board using the measured voltage, as mentioned above in the discussion of FIG. 1. Performing the measurement and returning to the timing mode quickly minimizes an effect on the voltage of capacitor C1.

While embodiments of the present invention have been described in the foregoing specification and drawings, it is to be understood that the present invention is defined by the following claims when read in light of the specification and drawings.

I claim:

1. A ballast for a high-intensity discharge (HID) lamp, comprising:

HID lamp ballast circuitry that includes a microcontroller having a first analog to digital input/output pin, a second analog to digital input/output pin, and a multifunction pin;

a temperature measurement circuit that includes a thermistor to sense a temperature, said temperature measurement circuit being connected to said second analog to digital input/output pin;

a further circuit connected to said first analog to digital input/output pin; and a switch connected to said multifunction pin, said temperature measurement circuit and said further circuit, said switch connecting said temperature measurement circuit to said multifunction pin in a first position and disconnecting said temperature measurement circuit from said multifunction pin in a second position, wherein said temperature measurement circuit is activated when said switch is in the first position and said further circuit is operated and said temperature measurement circuit is deactivated when said switch is in the second position.

2. The ballast of claim 1, wherein said further circuit is a voltage divider circuit.

3. The ballast of claim 1, wherein said further circuit is a timing circuit that comprises a resistor and a capacitor connected in series between said first analog to digital input/output pin and a ground.

4. The ballast of claim 3, wherein said multifunction pin is arranged to provide (a) a digital input/output for charging and discharging said capacitor and (b) a high impedance for measuring a voltage of said capacitor.

5. The ballast of claim 1, further comprising a power supply, wherein said temperature measurement circuit further comprises a first resistor connected between said power supply and a first node, wherein said second analog to digital input/output pin is connected to said first node, and wherein said thermistor is connected between said first node and a ground.

6. The ballast of claim 5, wherein said further circuit is a timing circuit that comprises a second resistor and a capacitor connected in series between said first analog to digital input/output pin and the ground.

7. The ballast of claim 6, wherein said switch comprises a transistor having a gate connected to said first node, a first terminal connected to said power supply and a second terminal connected to a second node, wherein said multifunction pin is connected to said second node, and wherein said timing circuit and said first analog to digital input/output pin are connected to said second node through a further resistor.

8. The ballast of claim 7, wherein said transistor is a MOSFET.

9. A ballast for a high-intensity discharge (HID) lamp, comprising:

HID lamp ballast circuitry that includes a microcontroller having a first analog to digital input/output pin, a second analog to digital input/output pin, and a multifunction pin;

a power supply;

a first resistor connected between said power supply and a first node, said second analog to digital input/output pin being connected to said first node;

a thermistor to sense a temperature and connected between said first node and a ground;

a transistor having a gate connected to said first node, a first terminal connected to said power supply and a second terminal connected to a second node, said multifunction pin being connected to said second node;

a second resistor connected between said second node and a third node, said first analog to digital input/output pin being connected to said third node; and a third resistor and a capacitor connected in series between said third node and the ground, wherein said microcontroller is arranged to measure a voltage at said first node with said multifunction pin and to determine a temperature from the measured voltage.

10. The ballast of claim 9, wherein said multifunction pin is arranged to provide (a) a digital input/output for charging and discharging said capacitor and (b) a high impedance for measuring a voltage of said capacitor.

11. The ballast of claim 9, wherein said transistor is arranged to connect said first node to said multifunction pin when said first analog to digital input/output pin has a low voltage and said second analog to digital input/output pin has a high impedance and to disconnect said first node from said multifunction pin when said first analog to digital input/output pin has a high impedance and said second analog to digital input/output pin has a low voltage.

* * * * *